United States Patent
Sailor et al.

(10) Patent No.: US 7,532,484 B1
(45) Date of Patent: May 12, 2009

(54) ELECTRONIC COMPONENT ASSEMBLY

(75) Inventors: Steven L. Sailor, Westfield, IN (US); Hugh R. Hunkeler, Kokomo, IN (US); Lee R. Hinze, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/069,469

(22) Filed: Feb. 11, 2008

(51) Int. Cl.
*H01R 9/00* (2006.01)
(52) U.S. Cl. ...................... 361/773; 439/751
(58) Field of Classification Search ............ 439/65, 439/751, 82; 361/773, 520, 523, 538, 531, 361/513, 517, 763, 774, 537
See application file for complete search history.

(56) References Cited

U.S. PATENT DOCUMENTS

| | | | | |
|---|---|---|---|---|
| 4,591,951 A | * | 5/1986 | Iwamoto et al. | 361/812 |
| 5,420,748 A | * | 5/1995 | Ryu | 361/537 |
| 5,769,907 A | * | 6/1998 | Fukuda et al. | 29/25.03 |
| 5,880,926 A | * | 3/1999 | Nishino et al. | 361/517 |
| 6,442,014 B1 | * | 8/2002 | Lin | 361/301.3 |
| 6,735,074 B2 | * | 5/2004 | Nakamura et al. | 361/520 |

* cited by examiner

*Primary Examiner*—Hae Moon Hyeon
(74) *Attorney, Agent, or Firm*—Douglas D. Fekete

(57) ABSTRACT

An electronic component assembly includes an electrical component assembled to a base and mounted to a support. The component electrical leads protrude through holes, along a channel, and make contact with connectors on the base. The base is formed of a polymeric material and contains protrusions for mechanically supporting the electrical component. When the base is mounted to the support, the connectors complete the electrical connection between the electrical component and the support.

13 Claims, 3 Drawing Sheets

ELECTRONIC COMPONENT ASSEMBLY

TECHNICAL FIELD OF INVENTION

The invention relates to an electronic component assembly for attaching an electronic component to a base. More particularly, this invention relates to such assembly wherein a lead from the component extends through a hole in the base and along a channel into contact with an electrical connector, such that when the base is mounted onto a support, the connector completes the electrical connection from the component to the support.

BACKGROUND OF INVENTION

It is known to mount large electronic components, such as capacitors and inductors, on a support such as a printed circuit board (PCB). The electrical connection is typically formed by inserting the wire leads on the component into holes in the PCB followed by a soldering operation. The mounted component is mechanically unstable due to the size and shape of the component, specifically the vertical dimension of the electronic component perpendicular to the PCB. In use, the mounted component may be subjected to vibration, which can lead to failure of the electrical connections due to cracks in the solder or pulling out of the wire leads from the hole in the PCB. It is desired to provide a mechanically stable mounting assembly for large electronic components, including a solderless connection to the PCB, to improve mechanical and electrical reliability.

SUMMARY OF THE INVENTION

In accordance with this invention, an electronic component assembly comprises an electrically insulating base with a first and second side. The base contains a hole extending from the first side to the second side and an electrical connector at the second side, outboard the hole. The second side of the base has a channel which extends between the hole and the electrical connector. An electronic component is assembled to the base by abutting the end face of the electronic component adjacent to the first side of the base. The electrical lead of the electronic component extends from the first side to the second side of the base through the hole, along the channel, and contacts the electrical connector.

In one aspect of this invention, an electronic component assembly comprises a polymeric base having a first side and a second side. The base is perpendicular to a central axis. The base includes a first hole extending from the first side to the second side, a first metal bushing outboard the first hole, and a first channel formed in the second side extending between the first hole and the first metal bushing. The base also includes a second hole extending from the first side to the second side, a second metal bushing outboard the second hole, and a second channel formed in the second side extending between the second hole and the second metal bushing. The electronic component assembled to the base comprises an end face abutting the first side of the base and a first lead extending from the end face. The first lead extends through the first hole, has a portion received within the first channel, and contacts the first metal bushing. The electronic component also comprises a second lead extending from the end face through the second hole and having a portion received within the second channel and contacting the second metal bushing. The base is mounted to a support with the second side of the base adjacent the support. The support comprises a first terminal received in the first metal bushing and a second terminal received in the second metal bushing.

In an alternate aspect of this invention, an electronic component assembly comprises a polymeric base having a first and second side. The base is perpendicular to a central axis and includes a first hole extending from the first side to the second side, a first metal pin outboard the first hole, and a first channel formed in the second side extending between the first hole and the first metal pin. The base also includes a second hole extending from the first side to the second side, a second metal pin outboard the second hole, and a second channel formed in the second side extending between the second hole and the second metal pin. The electronic component assembled to the base comprises an end face abutting the first side of the base and a first lead extending from the end face. The first lead extends through the first hole, has a portion received within the first channel, and contacts the first metal pin. The electronic component also comprises a second lead extending from the end face through the second hole and having a portion received within the second channel and contacting the second metal pin. The base is mounted to a support with the second side of the base adjacent the support. The support comprises a first metal via configured to receive the first metal pin and a second metal via configured to receive the second metal pin.

Further features and advantages of the invention will appear more clearly on a reading of the following detailed description of the preferred embodiment of the invention, which is given by way of non-limiting example only and with reference to the accompanying drawings.

BRIEF DESCRIPTION OF DRAWINGS

This invention will be further described with reference to the accompanying drawings in which.

DETAILED DESCRIPTION OF INVENTION

Figure 1:
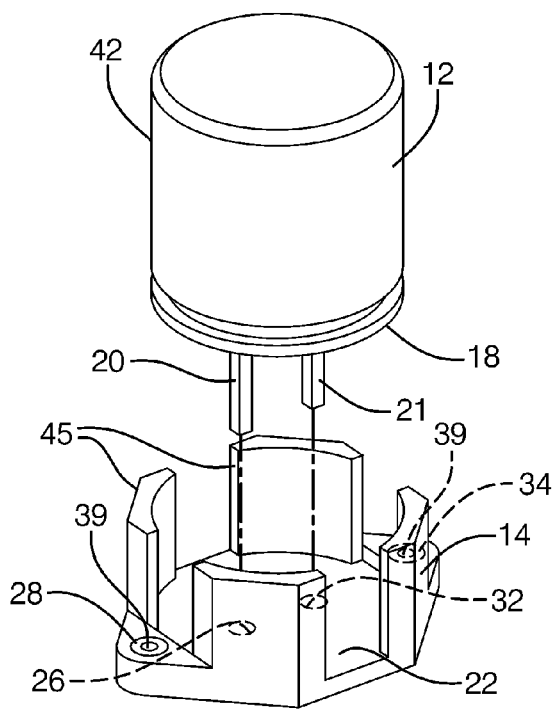
FIG. 1 is an exploded, perspective view showing an arrangement comprising an electronic component and a base for use in accordance with this invention.
Figure 2:
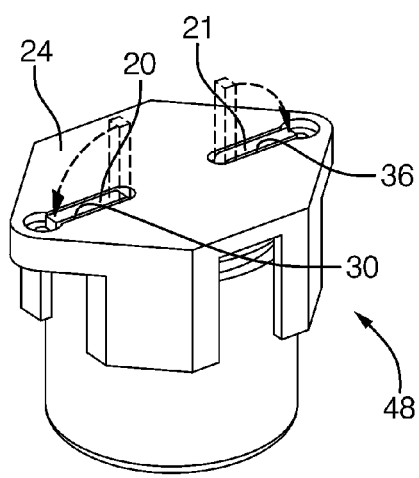
FIG. 2 is a bottom view of the arrangement in FIG. 1.
Figure 3:
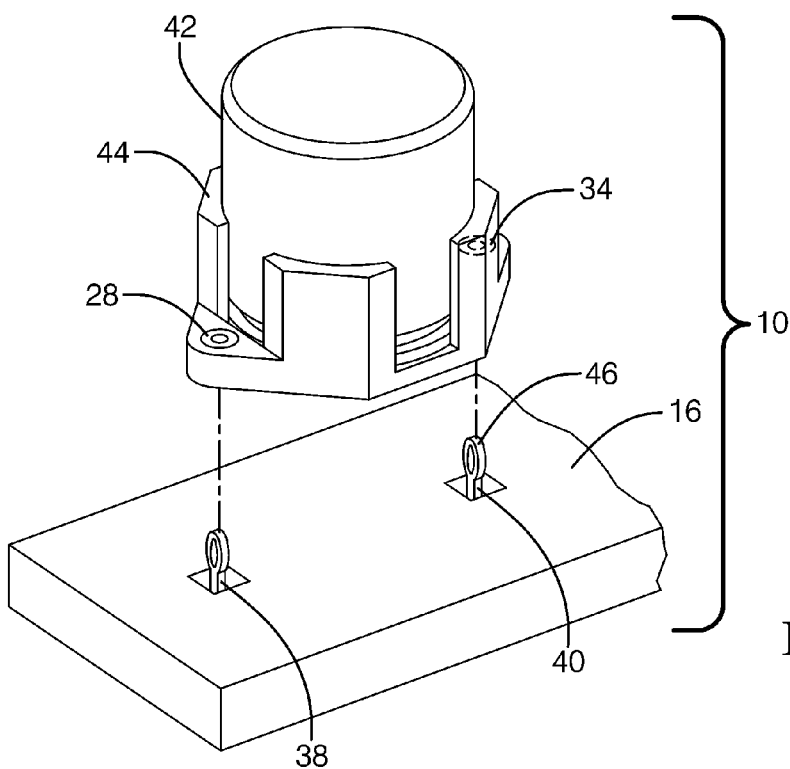
FIG. 3 is an exploded, perspective view showing an electronic component assembly in accordance with this invention.
Figure 4:
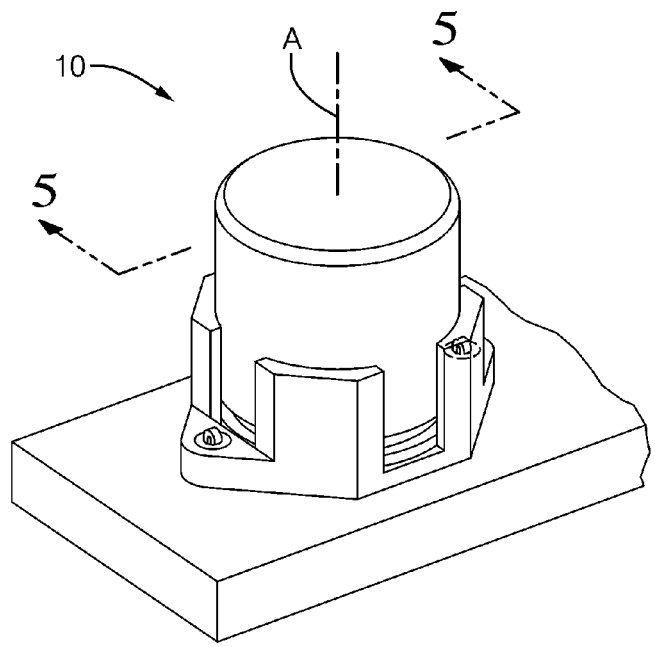
FIG. 4 is a perspective view showing the electronic component assembly in FIG. 3.
Figure 5:
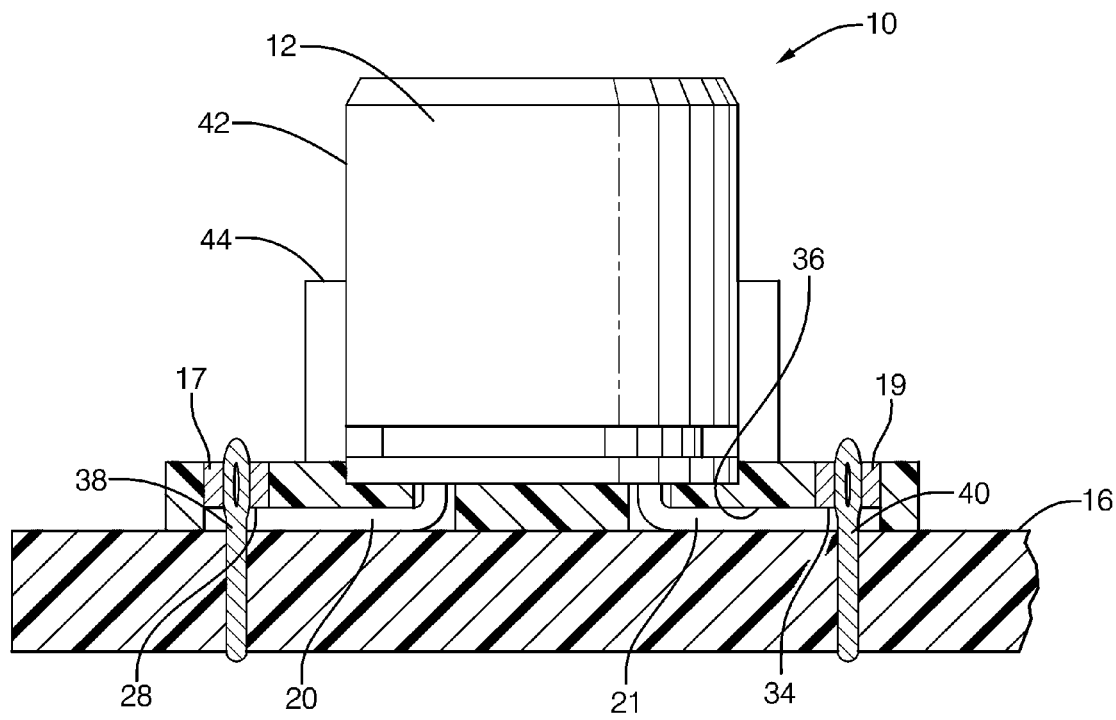
FIG. 5 is a cross-section of the electronic component assembly in FIG. 4 taken along line 5-5 in the direction of the arrows.

In accordance with a preferred embodiment of this invention, referring to FIGS. 1 through 5, an electronic component assembly 10 comprises an electronic component 12 such as a capacitor or inductor, secured to a polymeric base 14 formed of an electrically insulative material, and mounted on a support 16. Support 16 provides mechanical support for the electronic component and base. Also, electrical connections are made between electronic component 12 and a circuit on support 16. A printed circuit board is a suitable support, however any means of supporting the component and providing electrical connection to a circuit would be acceptable. The assembly includes an axis A, shown in FIG. 4, that is perpendicular to support 16 and about which component 12 is symmetrical.

Component 12 includes an end face 18 perpendicular to axis A. A first lead 20 and a second lead 21 extend from end face 18 parallel to axis A.

Base 14 is made of a polymeric material and has a first side 22, perpendicular to axis A and a second side 24, parallel to the first side. Base 14 comprises a first hole 26 extending from the first side 22 to the second side 24, a first electrical connector 17 comprising a first metal bushing 28 outboard first hole 26, and a first channel 30, perpendicular to Axis A. First channel 30 is formed in second side 24, extending between first hole 26 and first metal bushing 28. Base 14 also comprises a second hole 32 extending from first side 22 to second side 24, a second electrical connector 19 comprising a second metal bushing 34 outboard second hole 32, and a second channel 36, perpendicular to Axis A. The second channel 36 is formed in second side 24, extending between second hole 32 and second metal bushing 34.

Electronic component 12 is assembled to base 14 and comprises an end face 18 abutting first side 22. End face 18 comprises a first lead 20 and a second lead 21 extending from end face 18. First lead 20 extends from end face 18 through first hole 26 and has a portion received within the first channel 30 and extending into contact with first metal bushing 28. Second lead 21 extends from end face 18 through second hole 32 and has a portion received within second channel 36 and extends into contact with second metal bushing 34.

Base 14 is formed to receive electronic component 12 and provide mechanical support to the component. First side 22 of base 14 engages end face 18 of the component to provide mechanical support perpendicular to axis A. The component sidewall 42 extends from end face 18 parallel to and at a radial distance from axis A. Sidewall 42 engages one or more circumferential segments 45 of protrusion 44 on base 14 to provide mechanical support parallel to axis A.

Base 14 is mounted to support 16 with second side 24 of base 14 adjacent support 16, providing further mechanical support of component 12. Support 16 comprises a first terminal 38 received in a bore 39 in the first metal bushing 28 and a second terminal 40 received in a bore 39 in the second metal bushing 34. First and second metal bushings 28, 34 are outboard protrusion 44, further enhancing the mechanical support of component 12. The mounting of base 14 to support 16 using terminal 38 received in bushing 28 and terminal 40 received in bushing 34 provides an electrical connection between component 12 and support 16.

The manufacture of electronic assembly 10 will now be described. Base 14 is formed by injection molding an insulating polymer material using a mold having the specific size and shape for receiving electronic component 12. Bushings 28 and 34 are formed of metal and placed in the mold cavity prior to injection of the polymer material, and become embedded within the polymer upon completion of the injection molding. First terminal 38 and second terminal 40 are received in bushings 28 and 34 and are not embedded in the polymer during molding. Terminals 38 and 40 are formed with an eye-shaped structure 46 to ensure a pressed fit into bushings 28 and 34, creating a solderless electrical connection between electronic component 12 and support 16.

Electronic component 12 is fitted into base 14 with end face 18 abutting the base first side 22 such that component leads 20 and 21 protrude through base holes 26 and 32. Leads 20 and 21 are then bent along channels 30 and 36, respectively, extending into contact with base metal bushings 28 and 34. This arrangement 48 is press fitted onto support 16, receiving terminal 38 into bushing 28 and terminal 40 into bushing 34. The eye-shaped terminals 46 enable an electrical connection between the support and the electronic component without the use of solder. This press fitted connection holds the second side 24 of base 14 in contact with support 16 to provide mechanical stability for electronic component 12. Electronic component 12 is further mechanically supported by the base protrusions 44 which engage component sidewall 42, circumferentially about component 12.

Thus, this invention provides an electronic component assembly, including a support such as a printed circuit board, mounted to a base which secures a large electrical component such as a capacitor. The base protrusions provide mechanical stability for the large electrical component, thereby reducing the risk of the component becoming dislodged from the support. The base further provides an electrical connection between the electronic component and the support without the use of solder. This solderless connection provides a robust electrical connection when the electronic assembly is subjected to vibration.

Figure 6:
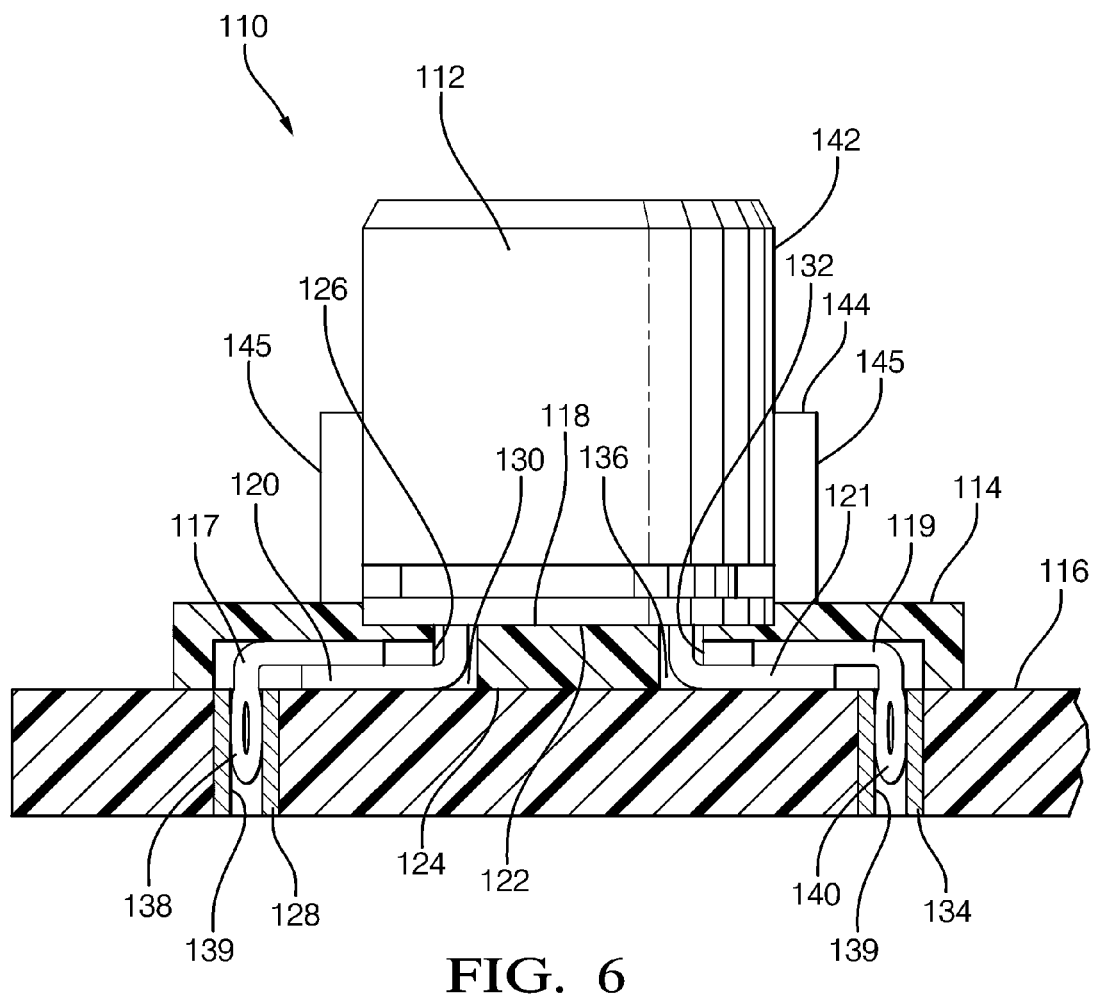
FIG. 6 is a cross-section of an electronic component assembly in an alternate embodiment of this invention.

In an alternate embodiment shown in FIG. 6, wherein like numerals designate corresponding elements to FIGS. 1-5, there is depicted an electronic component assembly 110 that includes an electrical component 112 assembled to a base 114 and mounted to a support 116. Component 112 includes a sidewall 142 extending from an end face 118. Base 114 comprises a protrusion 144 extending from a first side 122 to engage sidewall 142 to hold component 112 to base 114. Protrusion 144 includes one or more segments 145 that are circumferentially spaced about component 112. Base 114 comprises a first electrical connector 117 that includes a first metal pin 138 located outboard a first hole 126, and a second electrical connector 119 that includes a second metal pin 140 located outboard a second hole 132. Component 112 is fitted into base 114 with end face 118 abutting first side 122 of base 114. Second side 124 of base 114 is adjacent support 116. A first lead 120 and a second lead 121 of component 112 protrude through first hole 126 and second hole 132 in base 114, respectively. Lead 120 is bent along a first channel 130 extending into contact with first metal pin 138, and second lead 121 is bent along a second channel 136 extending into contact with second metal pin 140. In this embodiment, first metal pin 138 is received in a bore 139 in a first metal bushing 128 in support 116 to provide electrical connection to lead 120, and second metal pin 140 is received in a bore 139 in a second metal bushing 134 in support 116 to provide electrical connection to lead 121.

Thus, this embodiment provides an alternative configuration for the electrical and mechanical connection between the base and the support. It may be desirable to have the male portion of this solderless connection on the base, in the form of metal pins, for ease of manufacture if the support already has components using metal vias on the support for mounting. The choice of which configuration to use in practice is largely dependant on the manufacturing process for the specific application.

While this invention has been described in terms of the preferred embodiments thereof, it is not intended to be so limited, but rather only to the extent set forth in the claims that follow.

We claim:

1. An electronic component assembly comprising:
 a base formed of a electrically insulative material comprising a first side and a second side, said base comprising a hole extending from the first side to the second side and an electrical connector at said second side outboard said hole, said base further comprising a channel formed in second side of the base extending between the hole and the electrical connector; and an electronic component assembled to the base adjacent the first side, said electronic component comprising a lead extending through the hole and having a portion received within the channel extending in contact with the electrical connector.

2. The electronic component assembly in accordance with claim 1, wherein said electrical connector is a bushing embedded within the base and having a bore adapted to receive a terminal.

3. The electronic component assembly in accordance with claim 1, wherein said electrical connector is a pin protruding from the base, said pin being adapted to be received within a bushing in a support.

4. The electronic component assembly in accordance with claim 1, wherein said base comprises means for attaching the electrical component to the base.

5. The electronic component assembly in accordance with claim 4, wherein said means comprises one or more protrusions extending from the first side and engaging a sidewall of the electrical component.

6. An electronic component assembly comprising:
a base formed of a polymeric material, said base comprising a first side and a second side, said base comprising a first hole extending from the first side to the second side, a first metal bushing outboard the first hole, and a first channel formed in the second side extending between the first hole and the first metal bushing, said base further comprising a second hole extending from the first side to the second side, a second metal bushing outboard the second hole, and a second channel formed in the second side extending between the second hole and the second metal bushing;
an electronic component assembled to the base and comprising an end face abutting the first side of the base, said electronic component comprising a first lead extending from the end face through the first hole and having a portion received within the first channel extending into contact with the first metal bushing, said electronic component comprising a second lead extending from the end face through the second hole and having a portion received within the second channel extending to the second metal bushing; and
a support, said base being mounted to the support such that the second side is adjacent the support, said support comprising a first terminal received in the first metal bushing and a second terminal received in the second metal bushing.

7. The electronic component assembly in accordance with claim 6, wherein said component comprises a sidewall extending from the end face, said base further comprising a protrusion extending from the first side and engaging the sidewall to hold the electronic component to the base.

8. The electronic component assembly in accordance with claim 7, wherein the protrusion comprises one or more segments that are circumferentially spaced.

9. The electronic component assembly in accordance with claim 6, wherein the first metal bushing and the second metal bushing are outboard the protrusion.

10. An electronic component assembly comprising:
a base formed of a polymeric material, said base comprising a first side and a second side, said base comprising a first hole extending from the first side to the second side, a first metal pin outboard the first hole, and a first channel formed in the second side extending between the first hole and the first metal pin, said base further comprising a second hole extending from the first side to the second side, a second metal pin outboard the second hole, and a second channel formed in the second side extending between the second hole and the second metal pin;
an electronic component assembled to the base and comprising an end face abutting the first side of the base, said electronic component comprising a first lead extending from the end face through the first hole and having a portion received within the first channel extending into contact with the first metal pin, said electronic component comprising a second lead extending from the end face through the second hole and having a portion received within the second channel extending to the second metal pin; and
a support, said base being mounted to the support such that the second side is adjacent the support, said support comprising a first metal bushing adapted to receive the first metal pin and a second metal bushing adapted to receive the second metal pin.

11. The electronic component assembly in accordance with claim 10, wherein said component comprises a sidewall extending from the end face, said base further comprising a protrusion extending from the first side and engaging the sidewall to hold the electronic component to the base.

12. The electronic component assembly in accordance with claim 11, wherein the protrusion comprises one or more segments that are circumferentially spaced.

13. The electronic component assembly in accordance with claim 10, wherein the first metal pin and the second metal pin are outboard the protrusion.

\* \* \* \* \*